(12) United States Patent
Cheng et al.

(10) Patent No.: US 11,418,887 B2
(45) Date of Patent: Aug. 16, 2022

(54) MEMS DEVICE WITH ENHANCED MEMBRANE STRUCTURE AND METHOD OF FORMING THE SAME

(71) Applicant: TAIWAN SEMICONDUCTOR MANUFACTURING COMPANY LTD., Hsinchu (TW)

(72) Inventors: Chun-Wen Cheng, Hsinchu County (TW); Chun Yin Tsai, Hsinchu (TW); Chia-Hua Chu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 80 days.

(21) Appl. No.: 16/904,560

(22) Filed: Jun. 18, 2020

(65) Prior Publication Data

US 2021/0067880 A1 Mar. 4, 2021

Related U.S. Application Data

(60) Provisional application No. 62/893,087, filed on Aug. 28, 2019.

(51) Int. Cl.
| | |
|---|---|
| *H04R 17/02* | (2006.01) |
| *B81B 3/00* | (2006.01) |
| *B81C 1/00* | (2006.01) |

(52) U.S. Cl.
CPC .......... *H04R 17/02* (2013.01); *B81B 3/0021* (2013.01); *B81C 1/00158* (2013.01); *B81B 2201/0257* (2013.01); *B81B 2203/0127* (2013.01); *B81B 2203/04* (2013.01); *H04R 2201/003* (2013.01)

(58) Field of Classification Search
CPC .............. H04R 17/02; H04R 2201/003; H04R 2307/023; H04R 2307/025; H04R 31/003; H04R 17/025; B81B 3/0021; B81B 2203/0127; B81B 2203/04; B81B 2201/0257; B81C 1/00158
See application file for complete search history.

(56) References Cited

U.S. PATENT DOCUMENTS

| 9,029,963 B2* | 5/2015 | Sparks | B81B 3/0018 |
| | | | 257/416 |
| 9,055,372 B2* | 6/2015 | Grosh | H01L 41/27 |
| 10,293,377 B2* | 5/2019 | Guedes | B06B 1/0603 |

* cited by examiner

*Primary Examiner* — Brian Ensey
(74) *Attorney, Agent, or Firm* — WPAT, P.C., Intellectual Property Attorneys; Anthony King

(57) ABSTRACT

A MEMS device and a method of manufacturing the same are provided. A semiconductor device includes a substrate and a membrane over the substrate. The membrane includes a piezoelectric material configured to generate charges in response to an acoustic wave. The membrane includes a via pattern having first lines that partition the membrane into slices such that the slices are separated from each other at a first region near an edge of the membrane and connected to each other at a second region.

20 Claims, 15 Drawing Sheets

MEMS DEVICE WITH ENHANCED MEMBRANE STRUCTURE AND METHOD OF FORMING THE SAME

PRIORITY CLAIM AND CROSS-REFERENCE

This application claims priority to U.S. Provisional Application No. 62/893,087 filed Aug. 28, 2019, the disclosure of which is hereby incorporated by reference in its entirety.

BACKGROUND

Micro-electro mechanical system (MEMS) devices have recently been developed and are commonly included in electronic equipment. The MEMS devices are micro-sized devices that include a number of elements (e.g., stationary or movable elements) for achieving electro-mechanical functionality. Various applications of MEMS technologies, e.g., motion sensors, pressure sensors, inertial sensors, printer nozzles and MEMS microphones have been widely adopted in modern consumer and electronic devices.

While extensive research has been conducted in hopes of improving techniques related to the membrane design in the MEMS devices, such techniques still fail to meet many requirements, including the need to increase sensitivity and robustness of MEMS membranes. Therefore, there is a need to further improve the structures and manufacturing methods of MEMS membranes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A to 1I are cross-sectional views of intermediate stages of a method of manufacturing a MEMS device, in accordance with some embodiments.

DETAILED DESCRIPTION

Figure 1A:
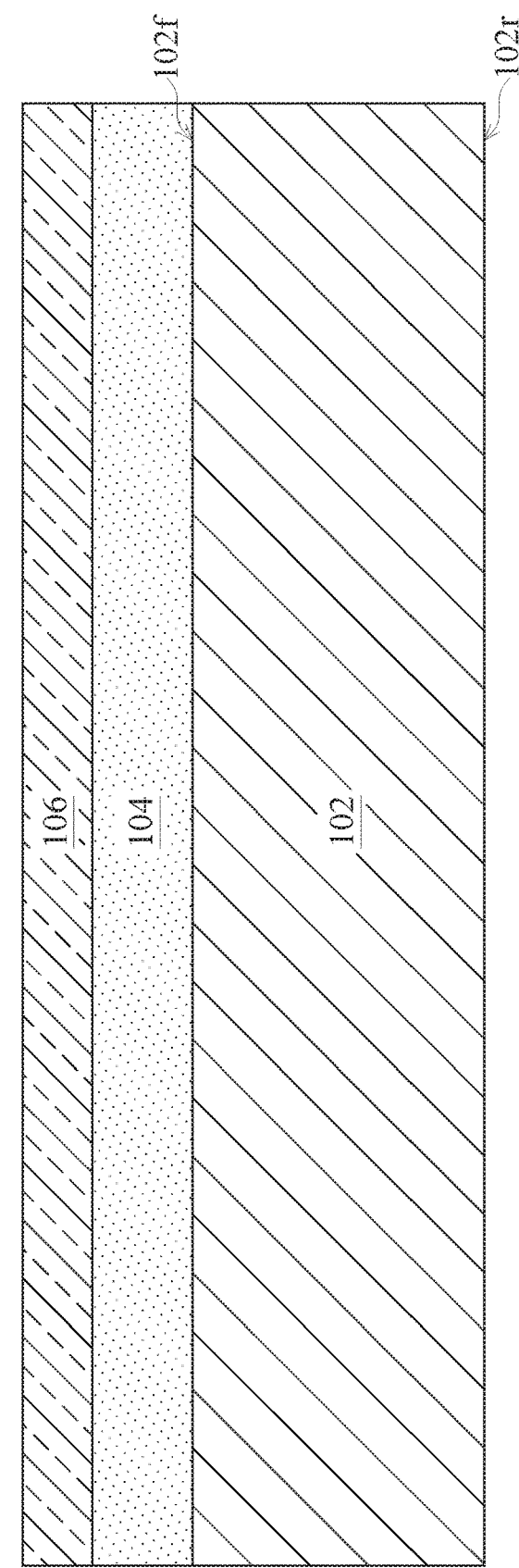

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" and "substantially" generally mean within 10%, 5%, 1% or 0.5% of a given value or range. Alternatively, the terms "about," "substantial" and "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The present disclosure discusses structures and fabrication methods of Micro-electro mechanical system (MEMS) devices, such as MEMS microphones. Embodiments of the present disclosure are provided. Each embodiment discusses one or more of the features of the proposed MEMS devices. Throughout the present disclosure, one feature with reference to one embodiment is also applicable to another embodiment, unless stated otherwise. Like numerals used throughout the present disclosure indicate like features across different embodiments or drawings.

A MEMS microphone is categorized as one of three types, i.e., a capacitive type, a piezoresistive type and a piezoelectric type. The capacitive-type microphone generally includes a capacitor having a fixed electrode and a movable electrode, in which the movable electrode is configured to move in response to impinging acoustic waves. An electrical voltage or current signal of the capacitor is derived from the varying capacitance between the fixed electrode and movable electrode. The conventional piezoresistive-type microphone includes piezoresistive material used to form a diaphragm. During operation, sound waves cause the diaphragm to vibrate, which, in turn, causes resistance changes proportional to the vibration. Sound waves are thus converted into electrical signals.

A piezoelectric-type microphone generally includes a deformable membrane formed of piezoelectric materials that are used to convert acoustic energy into electrical signals and vice versa. The deformable membrane contains partitioned cantilever beams suspended in a cavity and configured to oscillate in response to received acoustic energy or controlling signals. The cantilever beams should provide sufficient flexibility for deflection to increase sensing sensitivity. On the other hand, the membrane should be rigid enough to withstand shock damage or high sound pressure.

In addition, in many applications the partitioned cantilever beams in the membrane are separated from one another at their tips around the center of the MEMS membrane. Such partitioned design may lead to the problem of beam mismatch or misalignment of the beam tips in a vertical direction perpendicular to the surface of the membrane. The beam mismatch may occur due to manufacturing variations in which some cantilever beams are formed to have a curved shape that bends upwardly while some other cantilever beams are formed to have a curved shape that bends downwardly before sensing is performed. The beam mismatch may leave undesired air gaps around the beam lips, and air leakage may occur due to the air gaps.

In order to address the above challenges, the present disclosure proposes a deformable membrane which is patterned into connected cantilever beams. The cantilever beams are patterned to be partially separated from one another by vias. Through the vias, each cantilever beam is anchored at one end and connected to an adjacent or opposite cantilever beam at another end. As a result of the connected cantilever beam design, the membrane robustness is enhanced. In addition, the via dimensions between adjacent cantilever beams are appropriately managed, and therefore the air pressure exerted onto the membrane can be effectively controlled. The effective control of the dimensions of the vias can facilitate capture of maximal acoustic energy using the cantilever beams while preventing the membrane from being damaged by venting excess air flow through the vias. Furthermore, since all cantilever beams are partially connected, the problem of beam mismatch is reduced or eliminated. In addition, the pattern that forms the cantilever beam allows high strain zones to exist not only in areas adjacent to the edge of the membrane, but also in zones closer to the center of the membrane, thereby increasing sensitivity of the microphone.

FIGS. 1A to 1I are cross-sectional views of intermediate stages of a method of manufacturing a MEMS device 10, in accordance with some embodiments. In some embodiments, the MEMS device 10 is a MEMS microphone. In some other embodiments, the MEMS device 10 is a MEMS acoustic sensor.

Referring to FIG. 1A, a substrate 102 is formed or provided. In some embodiments, the substrate 102 is a carrier substrate and may be formed of glass, ceramic or other dielectric materials. The substrate 102 may be a semiconductor substrate, such as a bulk semiconductor, a semiconductor-on-insulator (SOI) substrate, or the like. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate layer that is typically formed of silicon or glass. Other substrates, such as a multi-layered or gradient substrate, may also be used. The substrate 102 may be doped (e.g., with a P-type or an N-type dopant) or undoped. In some embodiments, the semiconductor material of the substrate 102 includes (monocrystalline) silicon; however, other materials are also possible, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A first dielectric layer 104 is deposited over a first surface (e.g., front surface) 102f of the substrate 102. In some embodiments, the dielectric layer 104 includes silicon oxide; however, other materials, such as silicon nitride, silicon carbide and silicon oxynitride, may also be used. The dielectric layer 104 is formed by thermal oxidation, thermal nitridation, physical vapor deposition (PVD) including sputtering and evaporation, chemical vapor deposition (CVD), atomic layer deposition (ALD), a combination thereof, or the like.

In some embodiments, another second dielectric layer (not shown) is deposited on a second surface (e.g., back surface) 102r of the substrate 102. In some embodiments, the second dielectric layer includes silicon oxide; however, other materials, such as silicon nitride, silicon carbide and silicon oxynitride, may also be used. In some embodiments, the second dielectric layer comprises a material that is same as or different from that of the first dielectric layer 104. The second dielectric layer is formed by thermal oxidation, thermal nitridation, PVD, CVD, ALD, a combination thereof, or the like.

A protection layer 106 is formed over the first surface 102f of the substrate 102. The protection layer 106 may provide mechanical support for the membrane 120 (shown in FIG. 1C) subsequently formed thereon. The protection layer 106 is formed of a material different from the first dielectric layer 104 with respect to etching selectivity. In some embodiments, the protection layer 106 is formed of silicon (such as polysilicon), germanium, silicon carbide, gallium arsenic, gallium phosphide, indium phosphide, indium arsenide, indium antimonide, SiGe, GaAsP, AlInAs, AlGaAs, GaInAs, GaInP, GaInAsP; combinations thereof, or the like. The protection layer 106 may be formed by PVD, CVD, ALD, a combination thereof, or the like.

Figure 1B:
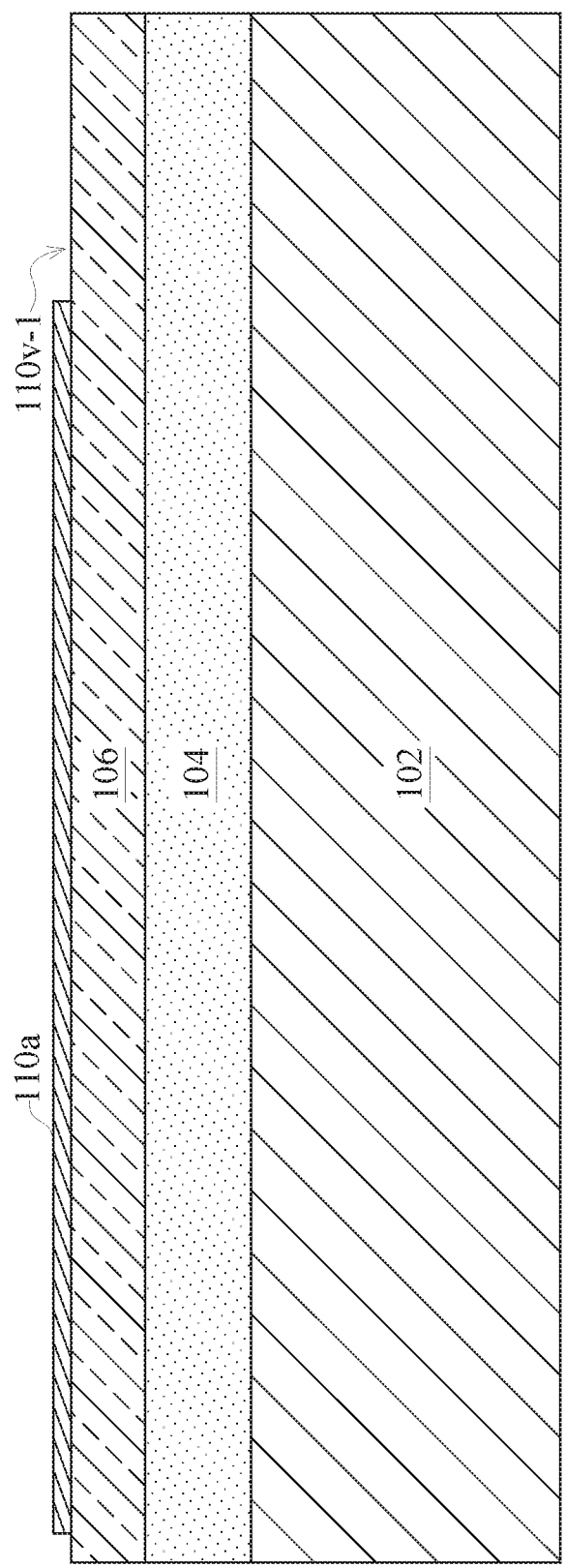

Subsequently, referring to FIG. 1B, a first electrode layer 110a is deposited over the protection layer 106. In some embodiments, the first electrode layer 110a may include conductive materials, e.g., materials having a high temperature coefficient of resistance. The first electrode layer 110a may include gold, silver, copper, tin, platinum, zinc, molybdenum, calcium, lead, iron, nickel, lithium, titanium, tungsten, aluminum, titanium nitride, combinations thereof, or the like. The first electrode layer 110a may be deposited to a thickness between about 5 nm and about 2000 nm. The first electrode layer 110a may be deposited by a suitable deposition process, such as PVD, CVD, ALD, electroplating, screen-printing, and the like.

In some embodiments, the first electrode layer 110a covers the protection layer 106 without patterns formed therein. In some embodiments, the first electrode layer 110a is further partitioned by a patterning operation. Vias 110v-1 with a via pattern 110p from a top-view perspective may be formed accordingly in the first electrode layer 110a to partition the first electrode layer 110a into several portions. The patterning operation may be performed using photolithography and etching operations. Portions of the upper surface of the first dielectric layer 104 are thus exposed.

Figure 1C:
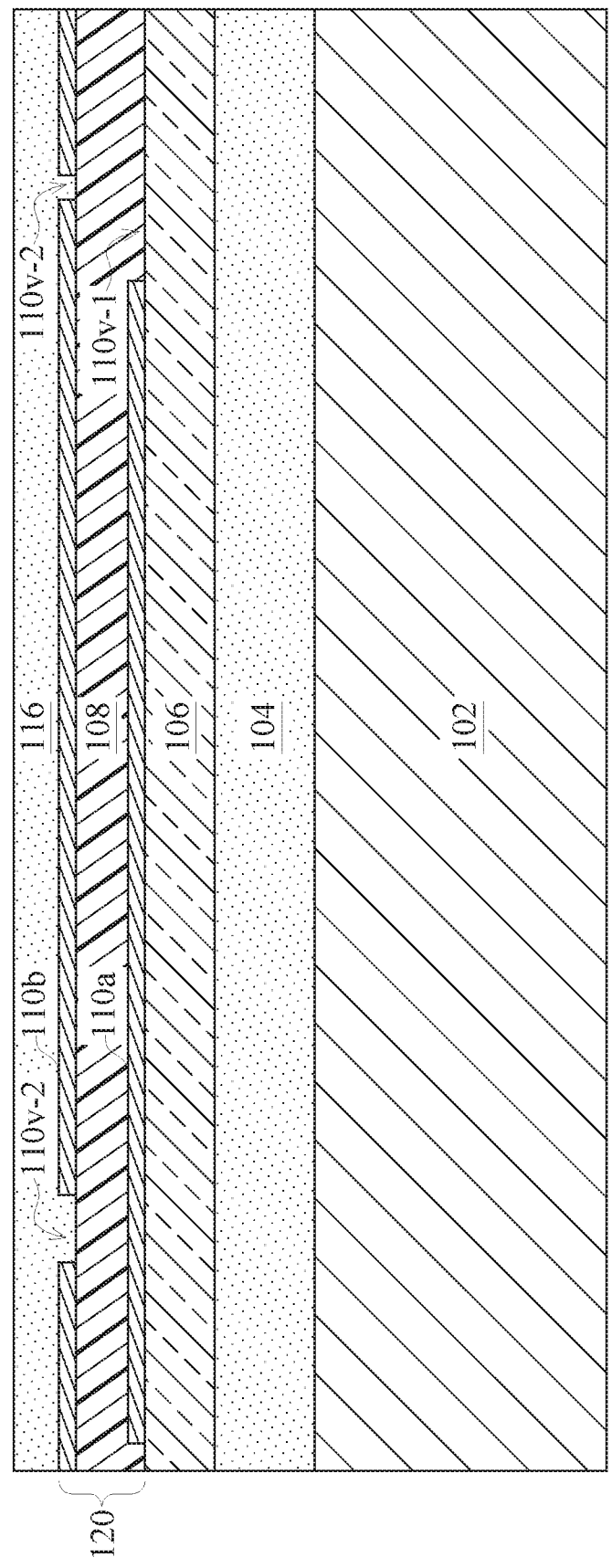

Referring to FIG. 1C, a piezoelectric layer 108 is deposited over the first electrode layer 110a. The piezoelectric layer 108 may include quartz single crystals, piezoelectric ceramics such as lithium niobate, gallium arsenide, zinc oxide, aluminum nitride and lead zirconate-titanate (PZT), polymer-film piezoelectrics such as polyvinylidene fluoride (PVDF), or the like. The piezoelectric layer 108 may be deposited to a thickness between about 5 nm and about 2000 nm. The piezoelectric layer 108 may be deposited by PVD, CVD, ALD, electroplating, screen-printing, sol-gel process, and the like.

Subsequently, a second electrode layer 110b is deposited over the piezoelectric layer 108. In some embodiments, the second electrode layer 110b covers the piezoelectric layer 108 without patterns therein. In some embodiments, the second electrode layer 110b is formed by a patterning operation. Vias 110v-2 with a via pattern 110q from a top-view perspective may be formed accordingly in the second electrode layer 110b to partition the second electrode layer 110b into several portions.

In some embodiments, the piezoelectric layer 108 along with the electrode layers 110a and 110b form a membrane, or a film, 120 of the MEMS device 10 and are configured to convert acoustic energy into electric charges in response to the deflection of the piezoelectric layer 108. The numbers and configurations of piezoelectric layer 108 and the electrode layers 110a and 110b for forming the membrane 120 are shown for illustrative purposes. Other materials and numbers of piezoelectric layers and electrode layers 110 suitable for forming the membrane 120 are also within the contemplated scope of the present disclosure. Throughout the present disclosure, the membrane 120 may also be referred to as a piezoelectric film. In some embodiments, during reflection of the membrane 120, the protection layer 106 is configured to deflect along with the deflection of the membrane 120 but does not function to convert acoustic energy into charges.

A passivation layer 116 is deposited over the membrane 120. In some embodiments, the passivation layer 116 includes dielectric materials, such as silicon oxide; however, other dielectric materials, such as silicon nitride, silicon carbide and silicon oxynitride, may also be used. The passivation layer 116 is formed by thermal oxidation, thermal nitridation, PVD, CVD, ALD, a combination thereof, or the like.

Figure 1D:
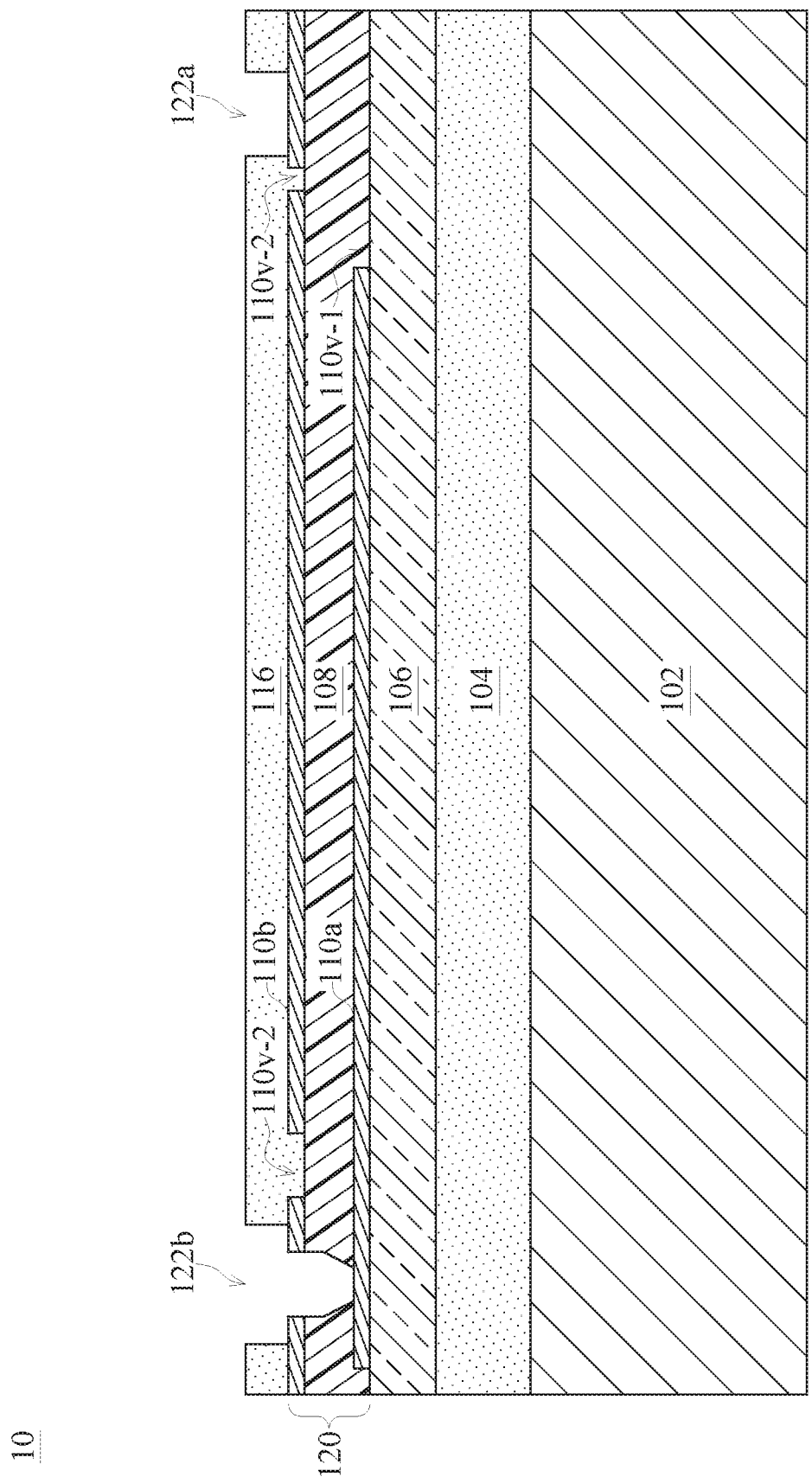

FIG. 1D illustrates the forming of recesses on an upper surface of the passivation layer 116. A recess 122a is formed through the passivation layer 116 and exposes the upper surface of the second electrode layer 110b. The recess 122a may be formed using an etching operation, such as a dry etching, a wet etching, an RIE, a plasma etching or the like, with the second electrode layer 110b acting as an etch stop layer. In some embodiments, the recess 122a has a circular shape or polygonal shape from a top-view perspective.

Similarly, a recess 122b is formed through the passivation layer 116, the second electrode layer 110b and the piezoelectric layer 108, and exposes the upper surface of the first electrode layer 110a. The recesses 122b may be formed using an etching operation similar to that used to form the recess 122a, in which more than one etch with different etchants may be conducted to etch different materials in the membrane 120. In some embodiments, the recess 122b has circular shapes or polygonal shapes from a top-view perspective.

Figure 1E:
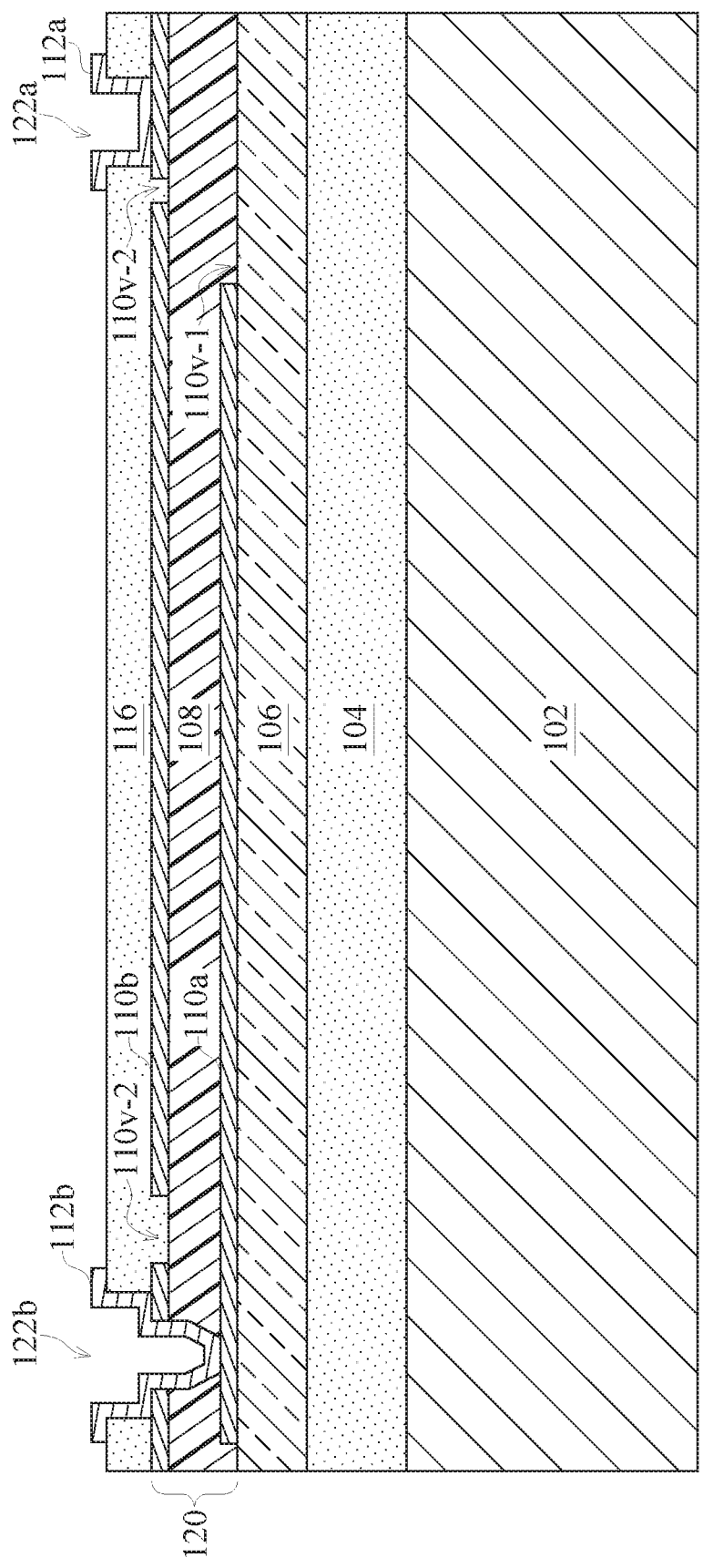

Referring to FIG. 1E, conductive lines 112a and 112b are formed and patterned over the passivation layer 116 and in the corresponding recesses 122a and 122b. A conductive material is initially conformally deposited over the upper surface of the passivation layer 116 and in the recesses 122a and 122b by PVD, CVD, ALD, electroplating, screen-printing or any suitable deposition process. The conductive material may include gold, silver, copper, tin, platinum, zinc, molybdenum, calcium, lead, iron, nickel, lithium, titanium, tungsten, aluminum, titanium nitride, combinations thereof, or the like. A patterning operation is performed to remove excess portions of the conductive material over the surface of the passivation layer 116 and leave the patterns of the conductive lines 112a and 112b as desired. For example, the conductive line 112a is electrically coupled to the upper surface of the second electrode layer 110b, and the conductive line 112b is electrically coupled to the upper surface of the first electrode layer 110a. In some embodiments, each of the conductive lines 112a and 112b includes a vertical portion on the sidewalls of the respective recesses 122a and 122b, and a horizontal portion extending over the surface of the passivation layer 116. In some embodiments, the vertical portion and a portion of the horizontal portion of the conductive line 112b is electrically coupled to the second electrode layer 110b.

Figure 1F:
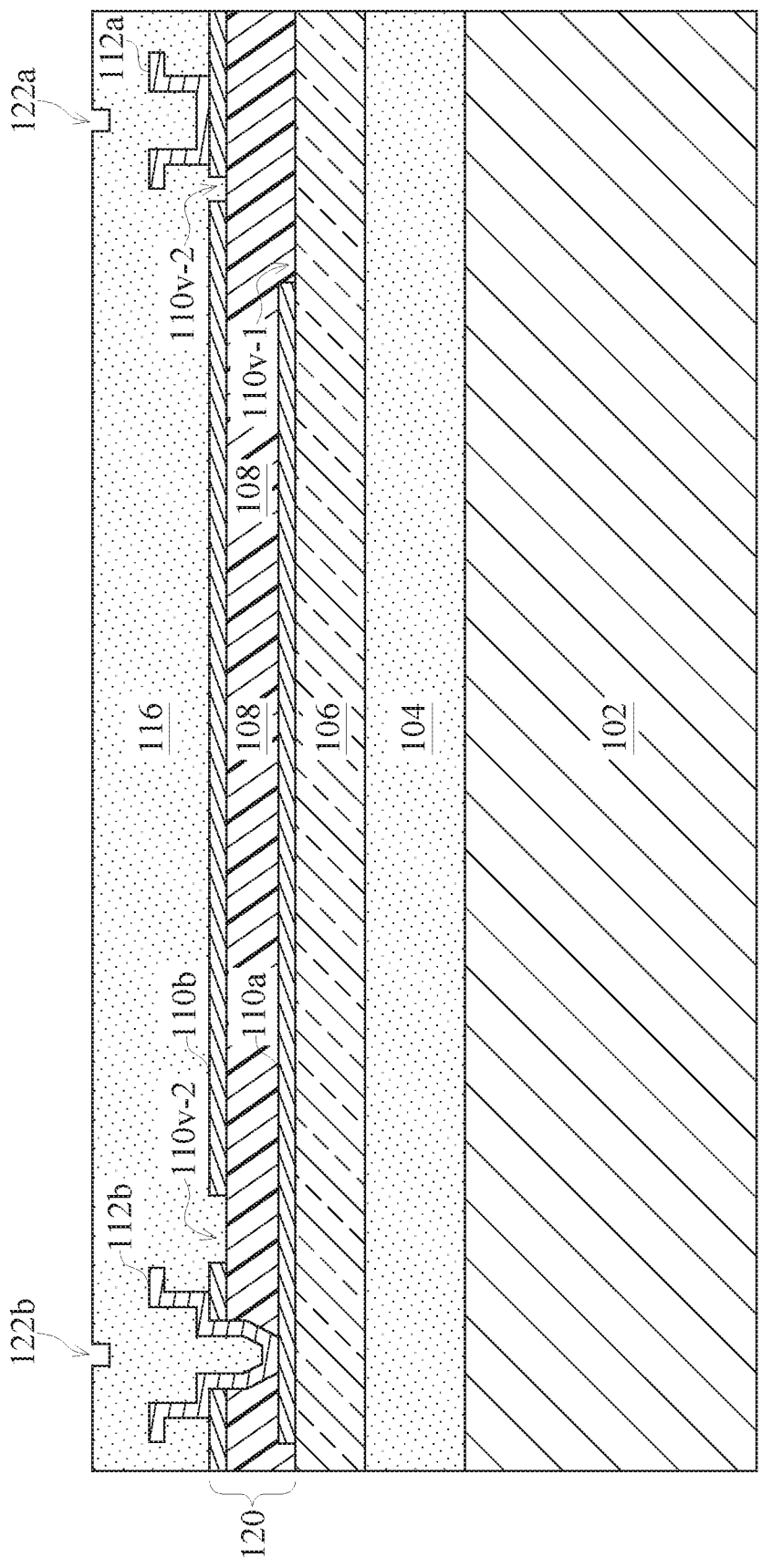

FIG. 1F illustrates the thickening of the passivation layer 116. The thickened passivation layer 116 fills the recesses 122a and 122b and covers the conductive lines 112a and 112b. The passivation layer 116 is thickened by thermal oxidation, thermal nitridation, PVD, CVD, ALD, a combination thereof, or the like. The passivation layer 116 may be deposited in a conformal manner, such that a dimple may be formed over each of the recesses 122a and 122b.

Figure 1G:
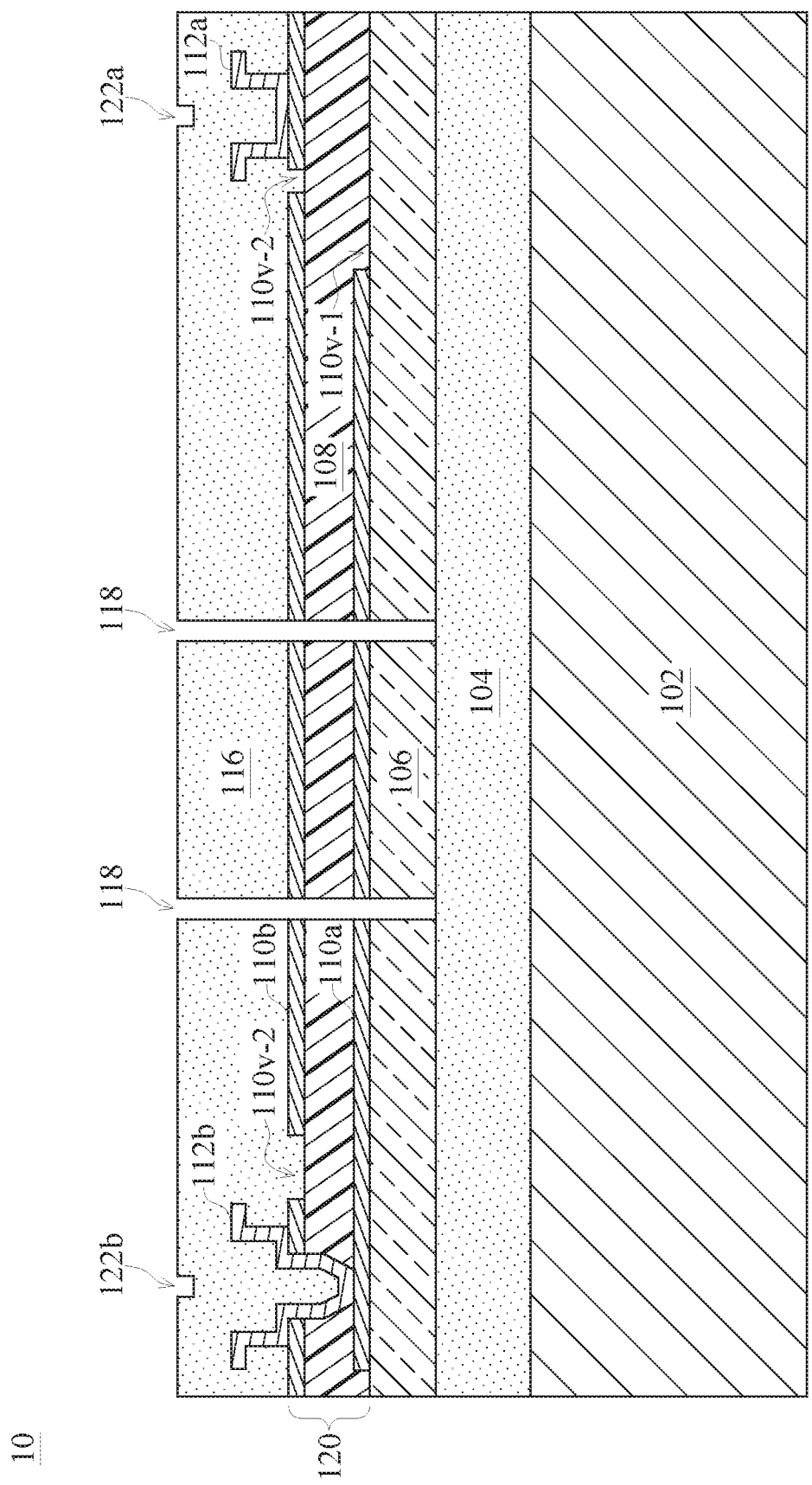

Subsequently, the passivation layer 116 and the membrane 120 are patterned through a patterning operation, as illustrated in FIG. 1G. Vias 118 are formed through the passivation layer 116, the membrane 120 (including the electrode layers 110a and 110b and the piezoelectric layer 108) and the protection layer 106 by an etching operation, such as a dry etching process. In some embodiments, the etch stops at the front surface of the first dielectric layer 104 facing the membrane 120. In other embodiments, the vias 118 extend downwardly into the substrate 102. Through the etching operation, the vias 118 are formed as having elongated lines and composing a via pattern from a top-view perspective, which defines the cantilever beams of the membrane 120. Details of the arrangement of the via pattern in the membrane 120 are provided in subsequent paragraphs with reference with FIGS. 2A to 2D and 3A to 3D.

Figure 1H:
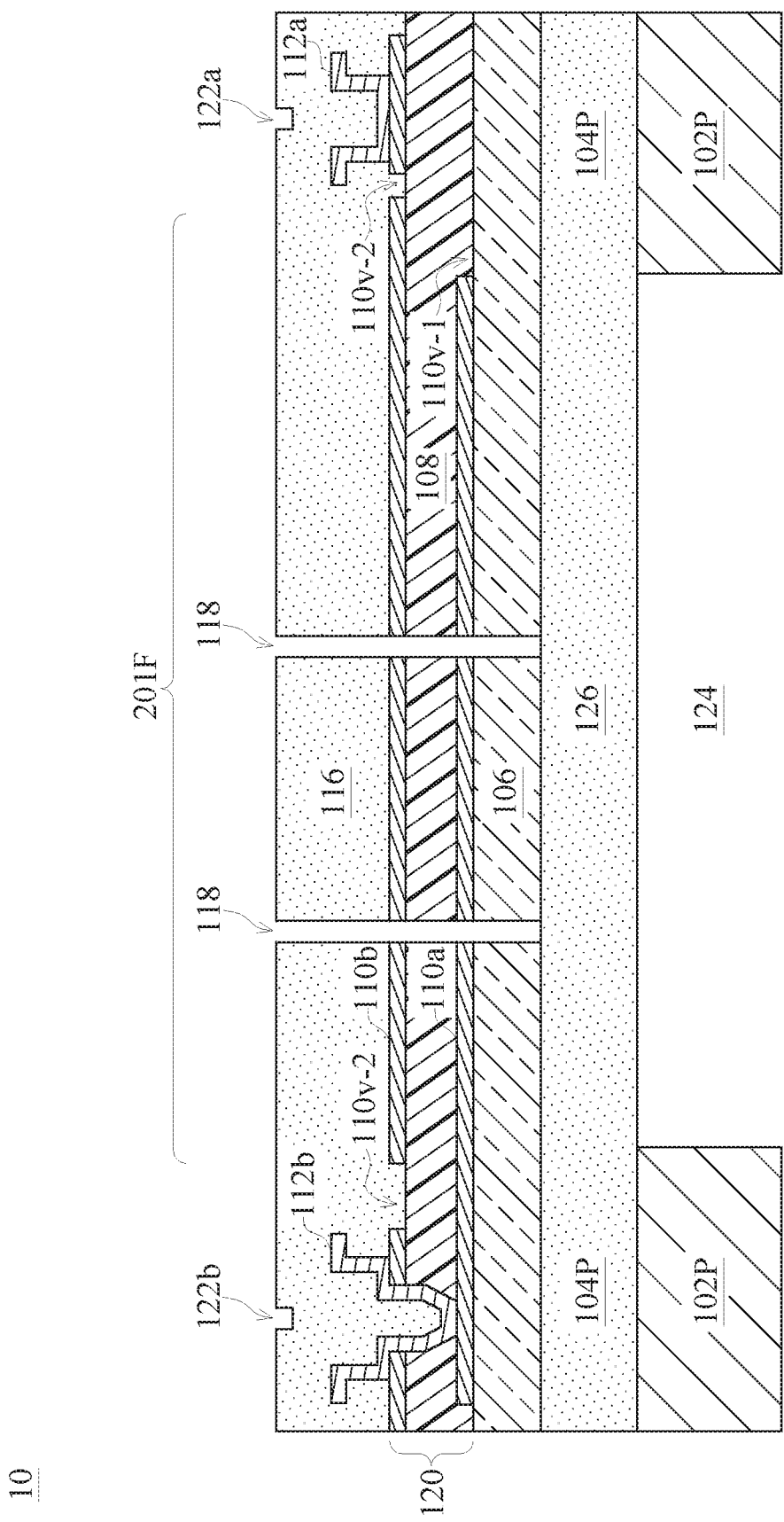
Figure 11:
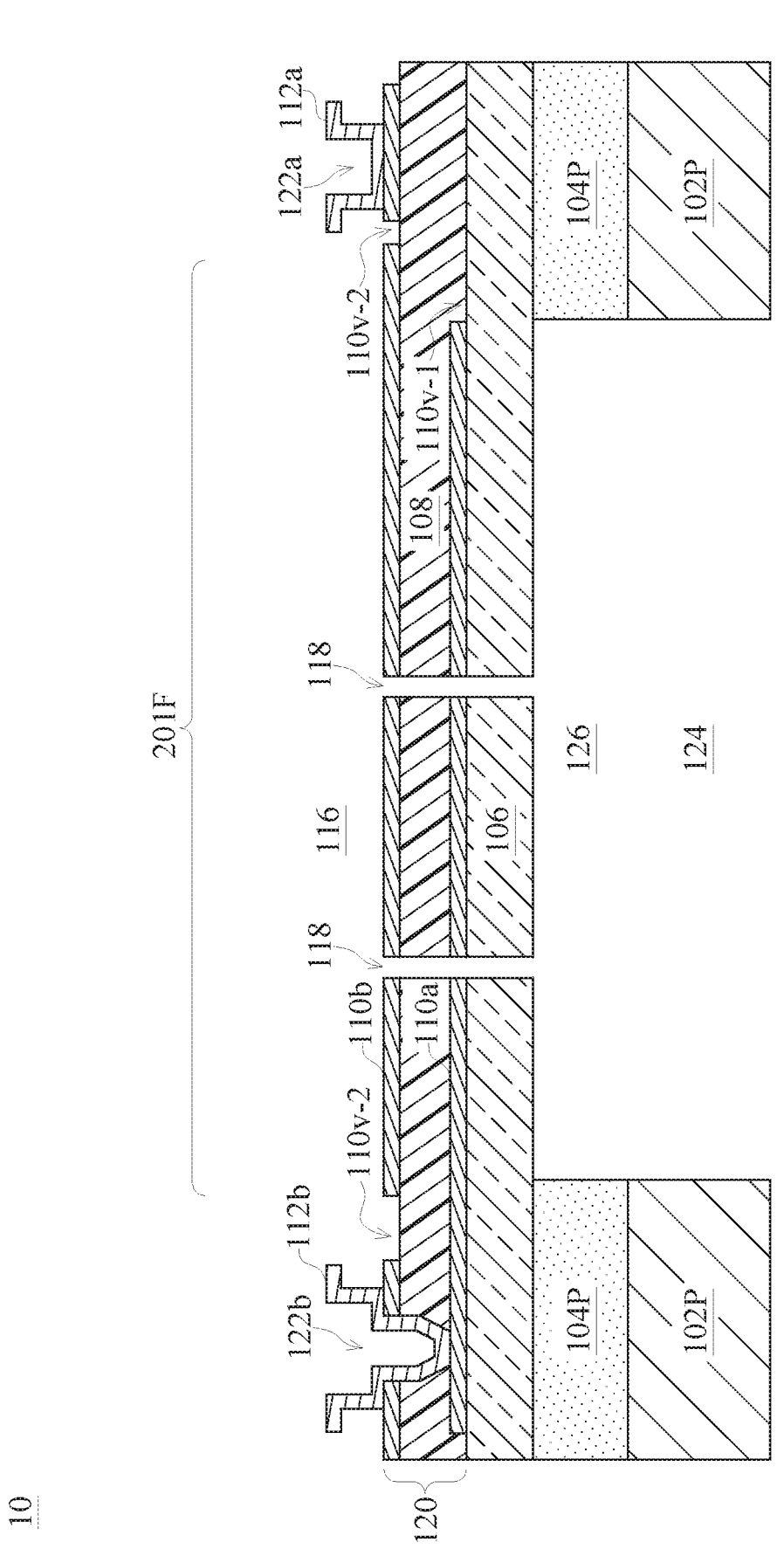

Referring to FIG. 1H, a cavity 124 is formed in the substrate 102. The cavity 124 may be formed through the substrate 102 by an etching operation, such as a dry etch, a wet etch, or a combination thereof. Portions of the thinned substrate 102 around the center are removed through a patterning operation, in which the cavity 124 has a polygonal shape or circular shape following the pattern of the membrane 120 as shown in FIGS. 2A to 2D and 3A to 3D. A patterned substrate 102P (e.g., a periphery of the substrate 102) is obtained by the etching operation and acts as an anchor fixing the membrane 120. In some embodiments, the patterned substrate 102P is further thinned to a thickness, e.g., in a range between about 200 μm to 500 μm.

FIG. 1I illustrates the patterning of the first dielectric layer 104 to form a patterned first dielectric layer 104P. A wet etching operation may be utilized to remove portions of the first dielectric layer 104 to thereby form a cavity 126 in communication with the cavity 124. A lower surface of the protection layer 106 is exposed to the cavity 126 through the patterning. In some embodiments, the cavity 126 has a polygonal shape or circular shape as shown in FIGS. 2A to 2D and 3A to 3D. In some embodiments, the etching operation is performed by subjecting the MEMS device 10 to vaporized HF. In some embodiments, the cavity 126 defined by the patterned first dielectric layer 104P has a width equal to or greater than a width of the cavity 124 defined by the patterned substrate 102P. In some embodiments, inner sidewalls of the patterned first dielectric layer 104P defining the cavity 126 is aligned with inner sidewalls of the patterned substrate 102P defining the cavity. In some embodiments, the patterned first dielectric layer 104P has a thinner width than the width of the patterned substrate 102P at the peripheral portion, therefore the cavity 126 is wider than the cavity 124. In some embodiments, the patterned substrate 102P fully overlaps the patterned first dielectric layer 104P. The first cavity 124 or the second cavity 126 may include a polygonal shape, such as an octagonal shape. However, other shapes, such as a quadrilateral shape, a hexagonal shape and a circular shape, are also possible.

In some embodiments, the cavity 124 defines a deformable area 201F of the membrane 120 in which the membrane 120 is deformable for performing sensing or actuation. The deformable area 201F in the cross-sectional view corresponds to a top view 201 of the membrane 120 shown in FIG. 2A.

In some embodiments, the passivation layer 116 is removed during the patterning of the first dielectric layer 104. Through the removal of the passivation layer 116, the conductive lines 112a and 112b and an upper surface of the membrane 120 are exposed. Furthermore, sidewalls of the membrane 120 at edges 180 (shown in FIGS. 2A to 2D and 3A to 3D) are also exposed. In a finalized condition, the membrane 120 is suspended over the cavities 124 and 126 with its sidewalls exposed and the membrane 120 is anchored at the patterned first dielectric layer 104P. In addition, the contiguous membrane 120 can freely oscillate in the cavities 124 and 126 and the vias 118 of the membrane 120 are used as air vents and function to moderate air pressure differences on two surfaces of the membrane 120 for protecting the membrane 120 from damage. In some embodiments, additional operations are performed to form conductive features (not separately shown) electrically coupling the conductive lines 112a and 112b to external circuits for performing acoustic sensing or actuation.

Figure 1J:
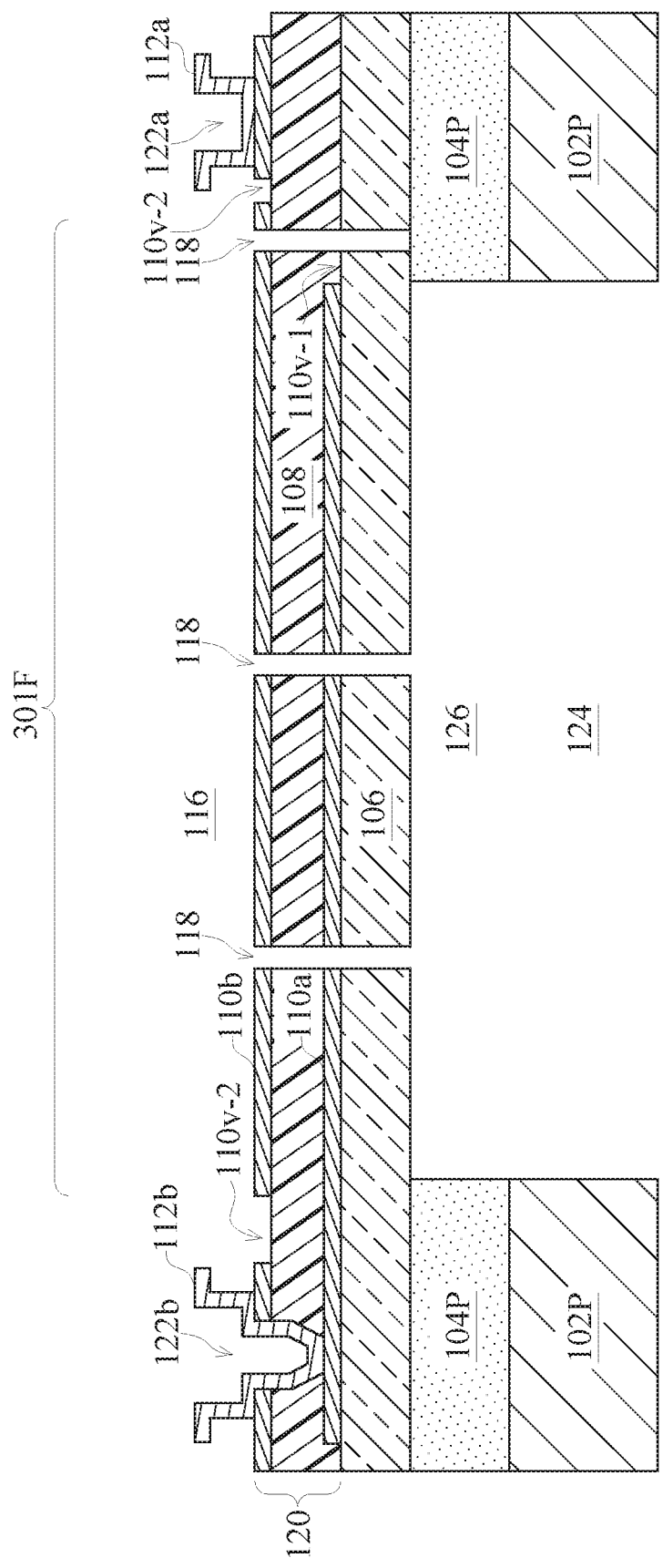
FIG. 1J is a cross-sectional view of a MEMS device, in accordance with some embodiments.

FIG. 1J is a cross-sectional view of the MEMS device 11, in accordance with some embodiments. The MEMS device 11 in FIG. 1J is similar to the MEMS device 10, expect that the MEMS device 11 includes an additional via 118 on the right side of the membrane 120. The additional via 118 exposes a portion of the patterned first dielectric layer 104P. As a result, portions of the membrane 120 adjacent to the additional via 118 may form a cantilever beam configured to bend toward the center of the membrane 120, details of which are provided in subsequent paragraphs. Further, a deformable area 301F shown in FIG. 1J corresponds to a top view 301 of the membrane 120 shown in FIG. 3A.

FIGS. 2A to 2D and 3A to 3D are schematic top views of various via patterns of the MEMS device 10, in accordance with some embodiments. The schematic top views shown in FIGS. 2A to 2D and 3A to 3D illustrate only the membrane 120, and other features may be omitted for clarity. FIGS. 2A to 2D and 3A to 3D show edges 180 of the membrane 120 and portions of the membrane 120 corresponding to the underlying patterned first dielectric layer 104P and the cavity 126, in which the patterned first dielectric layer 104P defines the cavity shape from a top-view perspective. FIGS. 2A to 2D and 3A to 3D also show that the membrane 120 has a movable portion suspended over the cavity 126 and an immovable portion coupled to and anchored at the patterned first dielectric layer 104P. Details of the remaining portions of the membrane 120 between the edge 180 and the cavity 126 are not illustrated for simplicity.

Figure 2B:
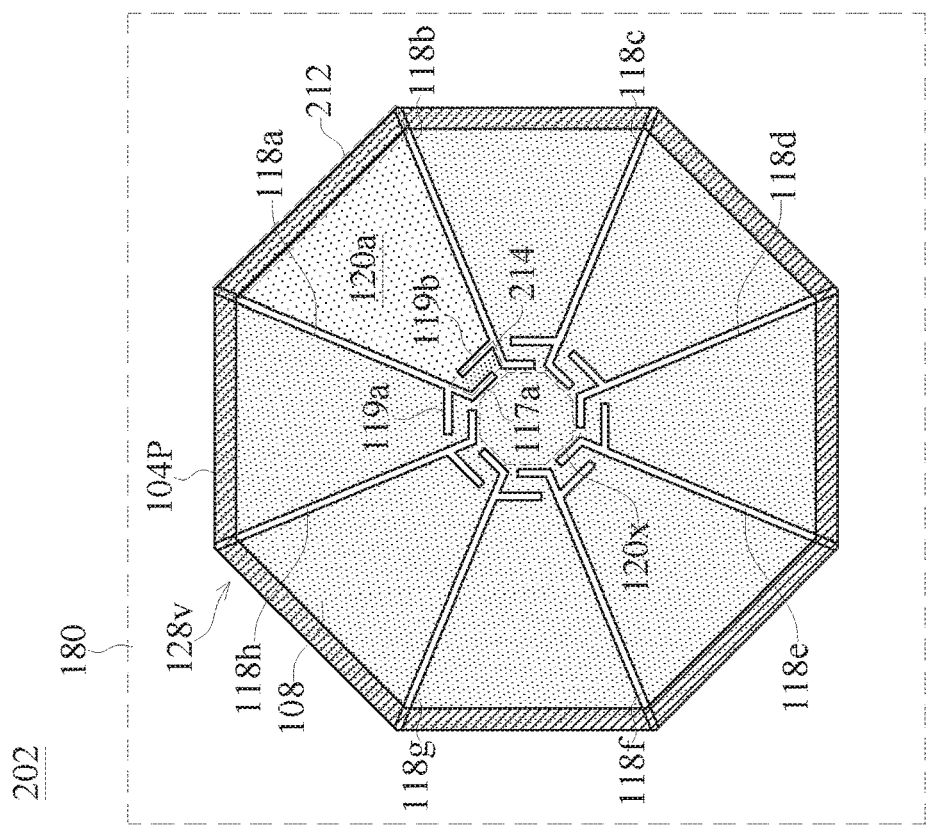
FIGS. 2A to 2D are schematic top views of various via patterns in a membrane, in accordance with some embodiments.
Figure 2A:
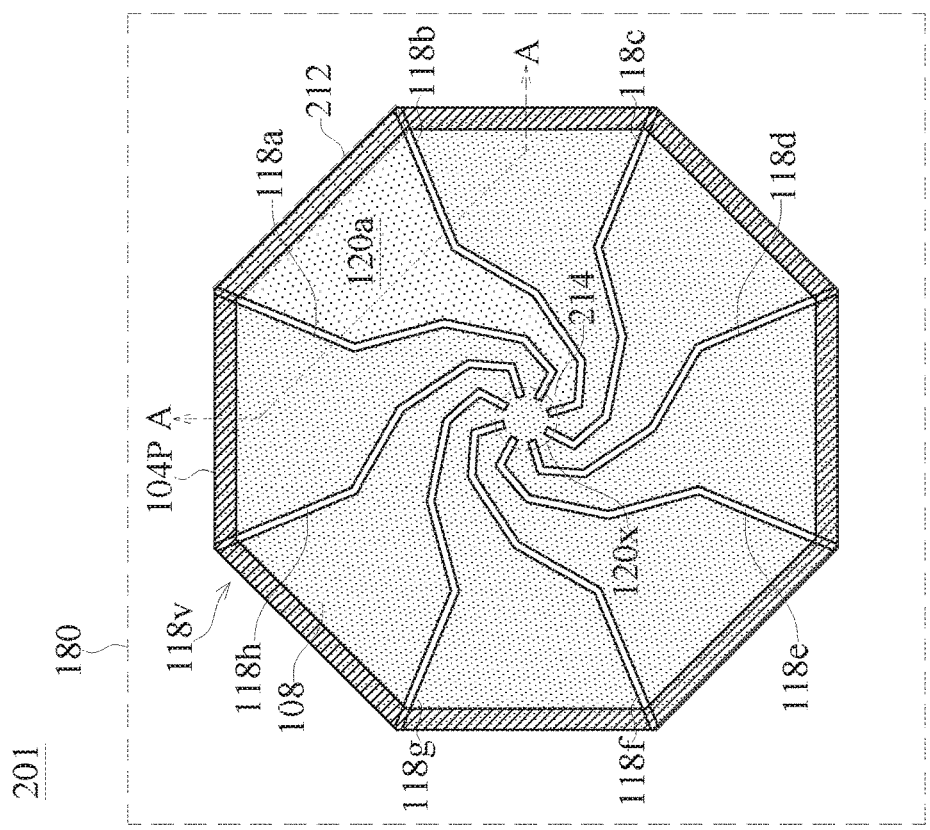

FIG. 2A is a top view 201 of a via pattern 118v of the membrane 120. The piezoelectric layer 108 is illustrated in FIG. 2A as the exposed surface of the membrane 120 and the second electrode layer 110b is omitted for clarity. The cross-sectional views of FIGS. 1A to 1I are taken along the sectional line AA shown in FIG. 2A. The top view 201 only covers details of the deformable area 201F of the membrane 120 in FIG. 1I.

Referring to FIGS. 2A and 1I, the patterned first dielectric layer 104P includes a circular shape or a ring shape in some embodiments. The membrane 120 is suspended over the cavity 126 and 124 and anchored at the patterned first dielectric layer 104P through the piezoelectric layer 108. In the present embodiment, a via pattern 118v is formed of the vias 118 as first type lines, e.g., lines 118a, 118b, 118c, 118d, 118e, 118f, 118g and 118h from a top-view perspective. The via pattern 118v partitions the membrane 120 into multiple (e.g., eight) slices in which an exemplary slice 120a is illustrated as a shaded region. In some embodiments, the via pattern 118v or the resualtant slices 120a is formed as a symmetrical pattern, e.g., with respect to the center of the membrane 120. In some other embodiments, the via patterns (e.g., 128v, 138v, . . . 188v) in FIGS. 2B-3D or their resualtant slices shown are also formed as symmetrical patterns, e.g., with respect to the center of the membrane 120. The slices discussed throughout the present disclosure are configured as movable cantilever beams that can deflect in an (acoustic) sensing or actuation operation. The slices are generally identical in shape and area; however, these slices may have different shapes or areas in other embodiments. In some embodiments, the vias 118 are equally spaced apart from one another to form the slices of substantially identical shapes and equal areas. These slices are partially separated from each other by the vias 118 in which the vias 118 are formed as elongated lines when viewed from above. In some embodiments, each of the vias 118 has an elongated shape from a top-view perspective with a width and a length, in which the length is greater than five times the width. In some embodiments, each of the vias 118 has a width and a length greater than ten times the width. In some embodiments, the vias 118 not only form the via pattern 118v but also function as venting holes that allow air to flow through the membrane 120.

In some embodiments, the membrane 120 has a width (or a diameter) from a top-view perspective between about 1 mm and about 10 mm, and the vias 118 have a line width from a top-view perspective between about 0.1 μm and about 4 μm, or between about 0.1 μm and about 1 μm. If the line width of the via 118 is greater than 4 μm, the problem of air leakage may be pronounced and the remaining membrane area may be insufficient to successfully capture energy of the impinging acoustic waves. If the line width of the via 118 is less than 0.1 μm, the resultant venting holes may be incapable of venting excess air and preventing the membrane from being damaged. In some embodiments, a ratio of a width of the line (via) 118 and the width of the membrane is between about 0.001 and about 0.1, or between about 0.005 and 0.05.

The slices of the membrane 120 are formed such that parts of the slices may move away from each other while other parts of the slices remain connected to one another. Using the slice 120a as an example, each of the slices in the membrane 120 includes a first region 212 at one end and a second region 214 opposite to the first region 212. Further, the via pattern 118*v* defines a connected region 120*x* that connects all slices. In some embodiments, each of the first type lines 118*a* to 118*h* exposes the patterned first dielectric layer 104P, as shown in FIG. 1J.

The first region 212 is anchored at the patterned first dielectric layer 104P and the second region 214 is connected to other slices through the connected region 120*x*. Throughout the present disclosure, the first regions 212 of the membrane 120, which are anchored at the patterned first dielectric layer 104P, are collectively referred to as an anchor region. Because the slices are all connected together through the connected region 120*x*, the membrane 120 is contiguous across all of the slices and regarded as a patterned one-piece structure. Air is allowed to flow only through the predetermined via pattern 118*v* instead of through gaps between misaligned slices. As a result, the problem of slice misalignment at the second regions 214 is mitigated.

The performance of the individual slices is further influenced by their shapes and locations of their connections to other slices. The shape of each slice is determined by formation of the via pattern 118*v*, i.e., the first type lines 118*a* through 118*h*. The first type lines 118*a* to 118*h* are disposed so that the slices can generate as many high strain zones as possible. In some embodiments, each of the first type lines 118*a* through 118*h* includes a polyline structure. For example, the via 118*a* includes a five-segment polyline. However, the polyline of each first type line 118*a* through 118*h* may include other numbers of segments.

In some embodiments, each of the first type lines 118*a* to 118*h* includes curved lines with no corners. In some embodiments, the via pattern 118*v* is a radial pattern in which the lines 118 extend from the connected region 120*x* and terminate at the locations of the membrane 120 directly over the patterned first dielectric layer 104P. In some embodiments, the lines 118 extend in a spiral pattern. In some embodiments, adjacent pairs of lines 118 are not parallel to each other.

In some embodiments, the patterned first dielectric layer 104P has a polygonal shape with sides and vertices connecting the sides. In such embodiments, the first type lines 118*a* through 118*h* expose the vertices of the patterned first dielectric layer 104P. In some embodiments, the first type lines 118*a* through 118*h* are formed to follow the sides of the patterned first dielectric layer 104P, and an included angle formed thereby is greater than 0 degrees and less than 90 degrees.

In some embodiments, the vias 118 are formed over the patterned first dielectric layer 104P. As a result, portions of the patterned first dielectric layer 104P are exposed through the vias 118. In some embodiments, each of the lines 118 includes at least a segment (i.e., a via segment) exposing the patterned first dielectric layer 104P.

The piezoelectric layer 108 of the slice in the piezoelectric membrane 120 is configured to deflect and generate strain in response to impinging acoustic waves and convert the strain into charges. The electrode layer 110*a* or 110*b* of the slice is configured to collect the generated charges and transmit these charges to a storage region or a detection circuit. Each slice of the membrane 120 is suspended over the patterned first dielectric layer 104P and configured to move with the first region 212 acting as a fixed anchor and the second region 214 and the connected region 120*x* acting as pseudo anchors. This means some regions in the membrane 120 (referred to as non-anchor regions throughout the present disclosure) are configured to deflect with a greater magnitude than those in the anchor or pseudo anchor regions, such as the first regions 212, the second regions 214 and the connected region 120*x*. The deflections around the non-anchor regions not only aid in generating high intensities of strain at areas around the first regions 212 adjacent to the patterned first dielectric layer 104P, but also aid in generating high or medium intensities of strain at areas around the connected region 120*x* and the second regions 214 of the slices. As a result, the overall device sensitivity is improved due to increased areas of high and medium intensities of strain. The efficiency of acoustic energy collection can be boosted, and the sensing or actuation performance is enhanced.

Referring to FIG. 2B, a top view 202 of a via pattern 128*v* is shown. The via pattern 128*v* includes three types of lines 117, 118 and 119 that partition the membrane 120 into slices. Specifically, the first type lines 118*a* through 118*h* extend radially from the anchor region 212 of the membrane 120 toward the center of the membrane 120, and the second type lines 117*a* through 117*h* are connected to respective first type lines 118*a* through 118*h*. Further, third type lines 119*a* through 119*h* branch from the respective first type lines 118*a* through 118*h* and are substantially parallel to the adjacent second type lines 117*a* through 117*h*. Each slice, e.g., slice 120*a*, includes a first region 212 anchored at the patterned first dielectric layer 104P and a second region 214 defined by the respective second type line, e.g., line 117*a*, and the third type line, e.g., line 119*b*, of the adjacent slice. Further, the slices are connected to the connected region 120*x*, which is defined by the second type lines 117*a* through 117*h*, through the second region 214.

In some embodiments, the via pattern 128*v* allows the membrane 120 to move with the first regions 212 acting as fixed anchors and the connected region 120*x* and the second regions 214 acting as pseudo anchors. As a consequence, deflections of greater magnitude occur around the non-anchor regions, such as the areas between the first regions 212 and the second regions 214 of the slices, and such deflections not only aid in generating high intensities of strain at areas around the first regions 212 adjacent to the patterned first dielectric layer 104P, but also aid in generating high or medium intensities of strain at areas in the second regions 214 of the slices. As a result, the overall sensitivity is improved due to increased areas of high and medium intensities of strain, and the sensing or actuation performance is enhanced.

Figure 2D:
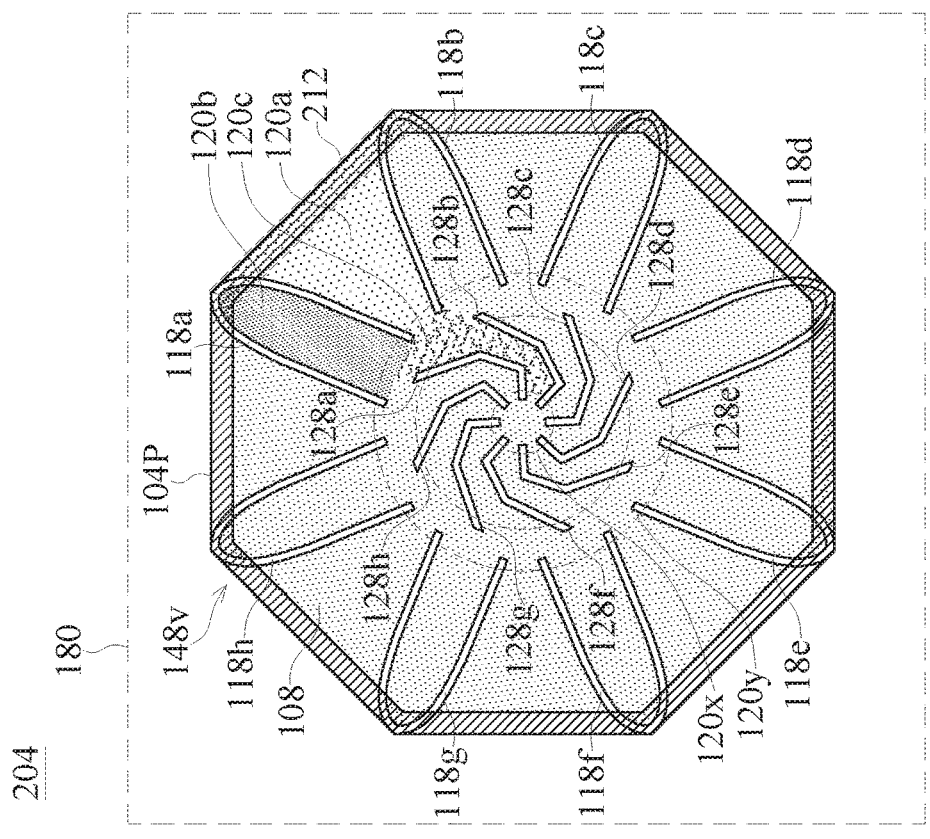
Figure 2C:
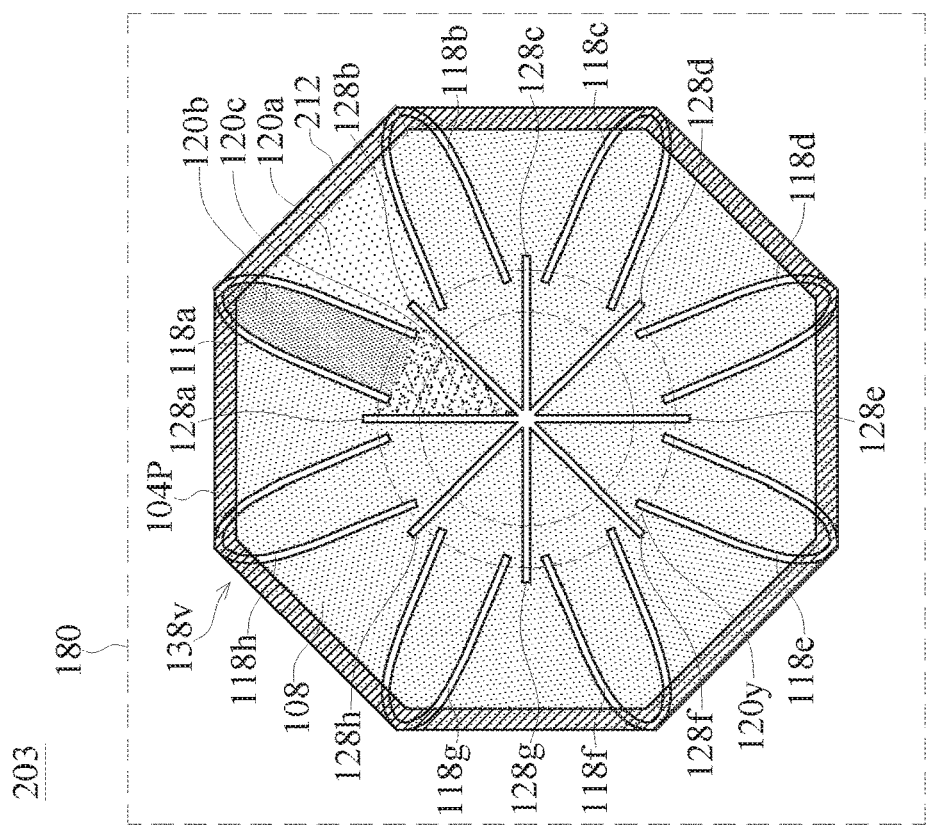

Referring to FIG. 2C, a top view 203 of a via pattern 138*v* is shown. The via pattern 138*v* partitions the membrane 120 into three types of slices, i.e., slices 120*a*, 120*b* and 120*c*. The via pattern 138*v* includes two types of lines 118 and 128 defining the three type of slices. Specifically, the first type lines 118, including lines 118*a* through 118*h*, have a cup shape with a cup bottom, in which the opening of the cup faces the center of the membrane and the cup bottom faces the edge 180 of the membrane 120. The second type lines 128, including lines 128*a* through 128*h*, are straight line segments that meet at the center of the membrane 120 and are disposed radially toward the edge 180 of the membrane 120. In some embodiments, the eight second type lines 128 form four straight lines crossing at the center of the membrane 120 from a top-view perspective. In some embodiments, the second type lines 128 are separated from the first type lines 118.

A connected region 120*y* is formed between the center and the first type lines 118. In some embodiments, the first type lines 118*a* through 118*h* partition the membrane 120 into multiple first type slices 102*a*. In some embodiments, each of the first type lines 118*a* through 118*h* defines a second type slice 102*b*. In some embodiments, the radially arranged second type lines 128 partition the membrane 120 into multiple third type slices 102*c*. The three types of slices 120*a*, 120*b* and 120*c* are connected together through the connected region 120*y*. In some embodiments, the second type slices 120*b* are aligned with the respective third type slices 120*c*.

During operation, the cup bottoms of the second type slices 120*b* are movable and are configured to bend toward the connected region 120*y* with a greater deflection magnitude than the deflection magnitude of other portions of the second type slices 120*b*. Similarly, the tips of the third type slices 120*c* at the center of the membrane 120 are movable and are configured to bend toward the connected region 120*y* with a greater deflection magnitude than the magnitude of other portions of the third type slice 120*c*.

In some embodiments, the via pattern 138*v* allows the membrane 120 to move with the first regions 212 acting as fixed anchors and the connected region 120*y* acting as a pseudo anchor. As a result, deflections of a greater magnitude occur around the non-anchor regions between the first regions 212 and the connected region 120*y* and the non-anchor regions around the center of the membrane 120, and such deflections not only aid in generating high intensities of strain at areas around the first regions 212 adjacent to the patterned first dielectric layer 104P, but also aid in generating high or medium intensities of strain at areas in the connected region 120*y*. As a result, the overall sensitivity is improved due to increased areas of high and medium intensities of strain, and the sensing or actuation performance is enhanced.

Referring to FIG. 2D, a top view 204 of a via pattern 148*v* is shown. The via pattern 148*v* is regarded as a variant of the via pattern 138*v* shown in FIG. 2C, and the second type lines 128, including lines 128*a* through 128*h*, in the via pattern 148*v* are polylines each including at least two line segments. In some embodiments, the individual second type lines 128 are separated from each other.

The via pattern 148*v* includes first type slices, 120*a*, second type slices 120*b*, third type slices 120*c* and a connected region 120*y* similar to those of the via pattern 138*v*. Further, the via pattern 148*v* includes another connected region 120*x* similar to that in the via pattern 118*v*. The third type slices 120*c* are connected to one another through the connected region 120*x*. In some embodiments, the first type slices 120*a* are aligned with the respective third type slices 120*c*.

In some embodiments, the via pattern 148*v* allows the membrane 120 to move with the first regions 212 acting as fixed anchors and the connected region 120*y* acting as pseudo anchors. As a consequence, deflections of greater magnitude occur around the non-anchor regions between the first regions 212 and the connected regions 120*y* and the non-anchor region at the connected region 120*y*, and such deflections not only aid in generating high intensities of strain at areas around the first regions 212, but also aid in generating high or medium intensities of strain at areas in the connected region 120*y*. As a result, the overall sensitivity is improved due to increased areas of high and medium intensities of strain, and the sensing or actuation performance is enhanced.

Figure 3B:
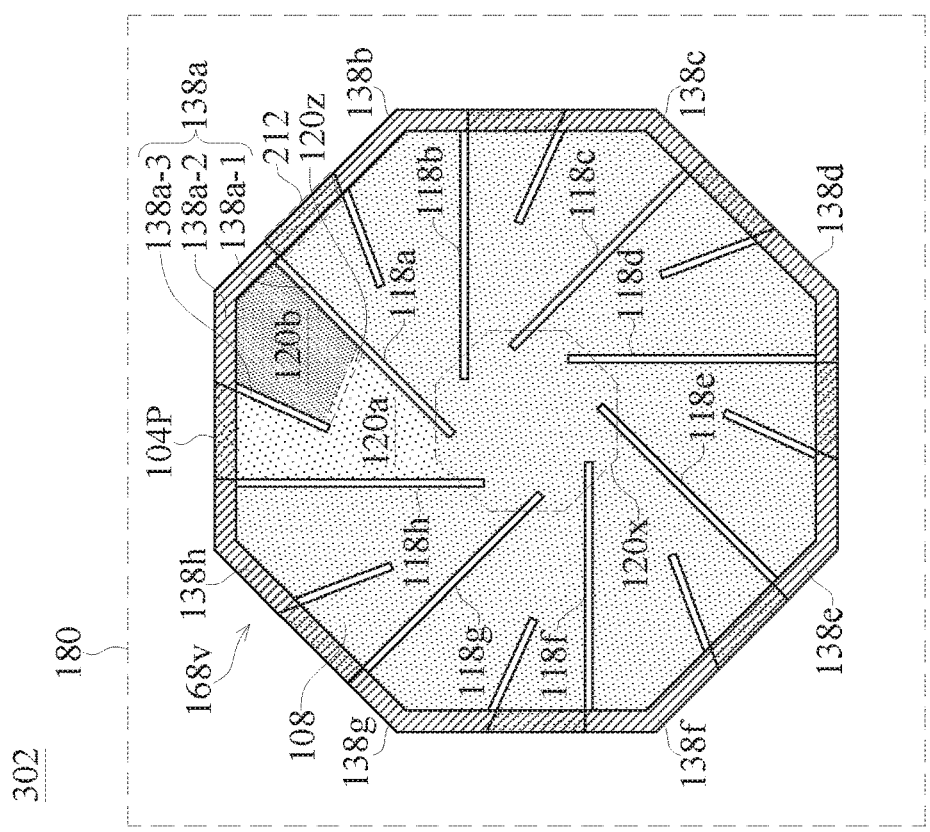
FIGS. 3A to 3D are schematic top views of various via patterns in a membrane, in accordance with some embodiments.
Figure 3A:
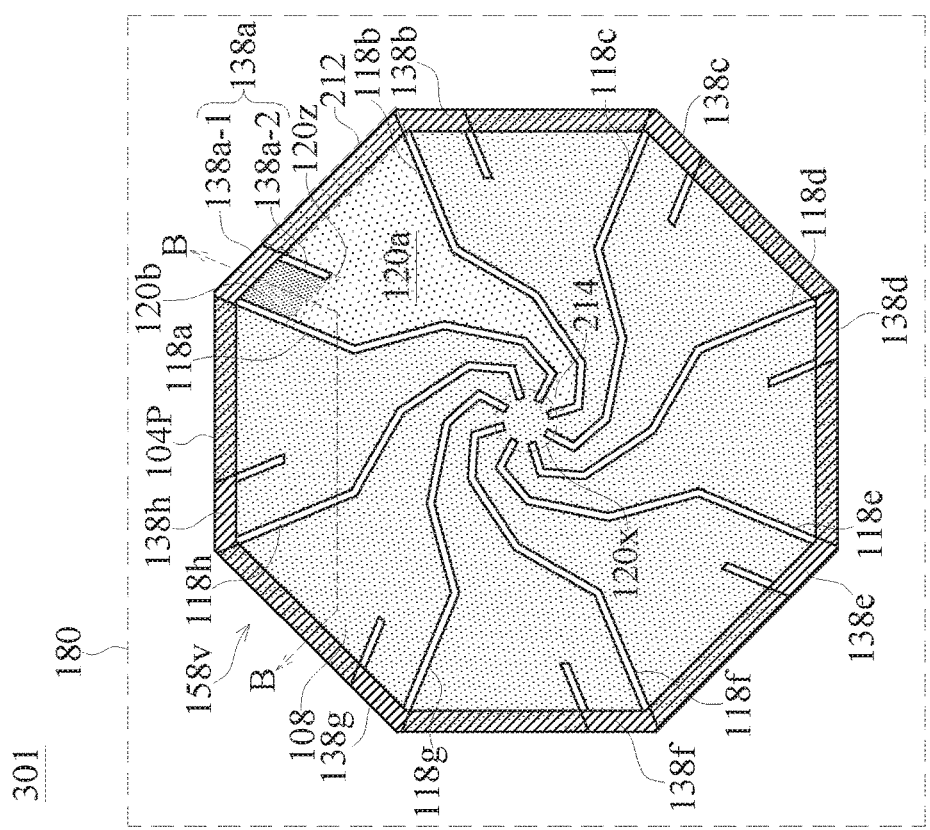

Referring to FIG. 3A, a top view 301 of a via pattern 158*v* is shown. The via pattern 158*v* is regarded as a variant of the via pattern 118*v* shown in FIG. 2A, and the via pattern 158*v* further includes second type lines 138, e.g., lines 138*a* through 138*h*. In some embodiments, each of the first type lines 118, e.g., line 118*a*, connects to a second type line 138, e.g., line 138*a*. The cross-sectional view of FIG. 1J is taken along the sectional line BB shown in FIG. 3A.

In some embodiments, each of the second type lines 138 includes two line segments. As an example, a second type line 138*a* is formed of a first line segment 138*a*-1 and a second line segment 138*a*-2 in communication with the first line segment 138*a*-1. In some embodiments, the first line segment 138*a*-1 is formed over the patterned first dielectric layer 104P. In some embodiments, the first line segment 138*a*-1 exposes the patterned first dielectric layer 104P. In some embodiments, the first line segment 138*a*-1 is formed on a side of the polygon of the membrane 120. In some embodiments, the first line segment 138*a*-1 is connected to the respective first type line 118*a*.

In some embodiments, the second line segment 138*a*-2 is connected to the first line segment 138*a*-1 and extends from the first region 212 of the membrane 120 toward the center of the membrane 120. In some embodiments, the second line segment 138*a*-2 is at least partially parallel to a portion of the respective first type line 118*a* through 118*h*, e.g., a line segment of the first type line 118*a* that is connected to the first region 212 of the membrane 120. In some embodiments, a width of the first type line segments 138-1 is different from a width of the second type line segments 138-2.

In some embodiments, the second type lines 138*a* aid in forming multiple additional second type slices 120*b* out of the first type slices 120*a*, in a manner similar to that of the formation of the second type slices 120*b* in FIG. 2C. In some embodiments, the first type slices 120*a* are in communication with the respective second type slices 120*b* through a connected region 120*z*. During operation, the second type slices 120*b* include movable sides adjacent to the first region 212 of the membrane 120. The movable sides are configured to bend toward the connected region 120*x* with a greater deflection magnitude than the deflection magnitude of other portions of the second type slices 120*b*.

In some embodiments, the via pattern 158*v* allows the membrane 120 to move with the first regions 212 acting as fixed anchors and the connected regions 120*x* and 120*z* acting as pseudo anchors. As a consequence, deflections of greater magnitude occur in the non-anchor regions, including the outer portions of the second type slices 120*b* adjacent to the edge 180 and the areas between the first regions 212 and the second regions 214, and such deflections not only aid in generating high intensities of strain at areas around the first regions 212, but also aid in generating high or medium intensities of strain at areas in the connected regions 120*x* and 120*z*. As a result, the overall sensitivity is improved due to increased areas of high and medium intensities of strain, and the sensing or actuation performance is enhanced.

Referring to FIG. 3B, a top view 302 of a via pattern 168*v* is shown. The via pattern 168*v* is regarded as a variant of the via pattern 158*v* shown in FIG. 3A, and the first type lines 118*a* through 118*h* in the via pattern 168*v* are formed as straight lines, or the first type lines 118*a* through 118*h* each include only one line segment.

The second type lines 138 of the via pattern 168*v* are similar to those of the via pattern 158*v*. In some embodiments, each of the second type lines 138 includes three line segments. As an example, a second type line 138*a* is formed of a first line segment 138*a*-1, a second line segment 138*a*-2 and a second line segment 138*a*-3 in communication with one another. In some embodiments, the first line segment 138*a*-1 and the second line segment 138*a*-2 are formed over the patterned first dielectric layer 104P. In some embodiments, the first line segment 138*a*-1 and the second line segment 138*a*-2 expose the patterned first dielectric layer 104P. In some embodiments, the first line segment 138*a*-1 and the second line segment 138*a*-2 are formed on adjacent sides of the polygon of the membrane 120 and are connected at a vertex of the polygon of the membrane 120. In some embodiments, the first line segment 138*a*-1 is connected to the respective first type line 118*a*.

In some embodiments, the third line segment 138*a*-3 extends from the anchor region 212 of the membrane 120 toward the center of the membrane 120. In some embodiments, the third line segment 138*a*-3 is at least partially parallel to the respective first type line 118*a*. In some embodiments, the third line segment 138*a*-3 has a length less than a length of the first type line 118*a*.

In some embodiments, the via pattern 168*v* functions according to a principle similar to that of the via pattern 158*v* and improves the overall sensitivity of the membrane 120 due to increased areas of high and medium intensities of strain, and the sensing or actuation performance is enhanced.

Figure 3C:
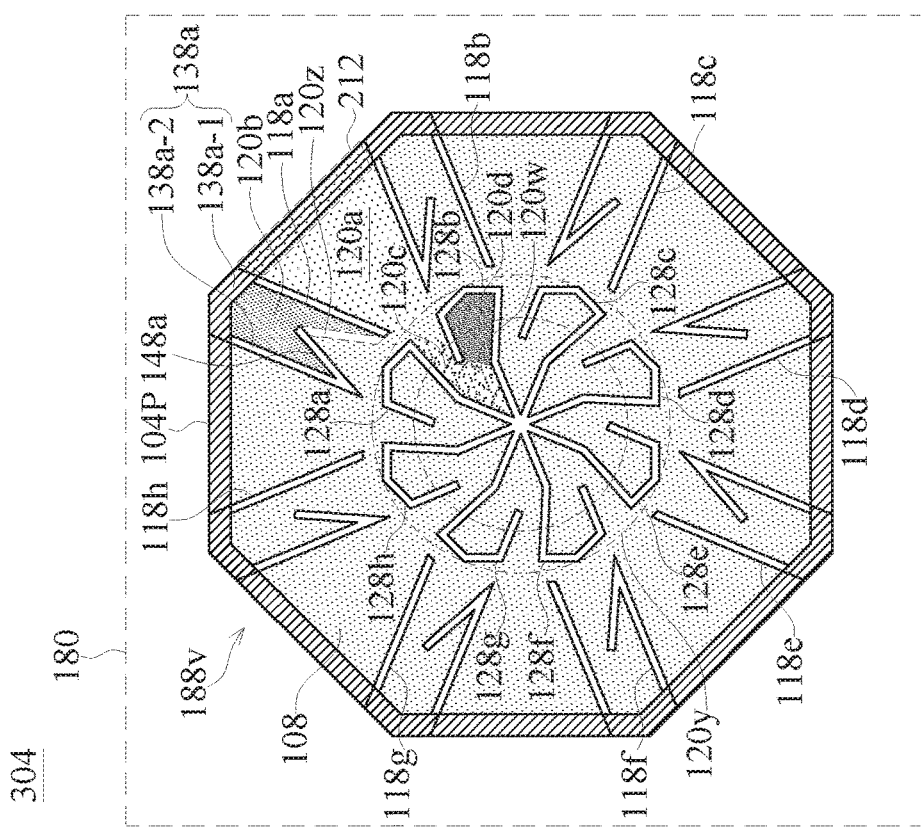

Referring to FIG. 3C, a top view 303 of a via pattern 178*v* is shown. The via pattern 178*v* is regarded as a variant of the via pattern 138*v* shown in FIG. 2C and the via pattern 168*v* shown in FIG. 3B, or a combination thereof. For example, the via pattern 178*v* also includes first type lines 118*a* through 118*h*, second type lines 128*a* through 128*h* and third type lines 138*a* through 138*h* that cooperatively partition the membrane 120 into three types of slices, i.e., slices 120*a*, 120*b* and 120*c*, of which the first type lines 118 are polylines, similar to those of the via pattern 168*v*, and the second type lines 128 are polylines, similar to those of the via pattern 138*v*.

The via pattern 178*v* further includes fourth type lines 148, e.g., fourth type line 148*a*, extending from an end of the respective third type line 138 toward an area surrounded by the first type line 118 and the third type line 138. In some embodiments, the fourth type line 148*a* extends between the first type line 118 and the second line segment 138*a*-2 of the third type line 138*a*. In some embodiments, the fourth type lines 148 extend in a direction nonparallel to a direction in which the first type line 118, e.g., line 118*a*, or the second line segment 138*a*-2, e.g., line 138*a*-2, extends.

In some embodiments, each of the second type lines 128 in the via pattern 178*v* includes at least two line segments. For example, the second type line 128*a* is formed of a first line segment 128*a*-1 and a second line segment 128*a*-2. The second line segments 128*a*-2 of the second type lines 128 meet at the center of the surface of the membrane 120. In some embodiments, the first line segment 128*a*-1 and the second line segment 128*a*-2 form an included angle of substantially 90 degrees. In some embodiments, the second type lines 128 are arranged in a spiral pattern. In some embodiments, the second type lines 128 in the via pattern 178*v* are separated from the first type lines 118 and the third type lines 138.

Similar to the slice configuration of the via pattern 168*v*, a connected region 120*z* around each of the second type slices 120*b* is formed in the via pattern 178*v* between the second type slices 120*b* and the connected region 120*y*. In some embodiments, the connected region 120*z* is formed between the first type lines 118, e.g., line 118*a*, and the respective fourth type lines 148, e.g., line 148*a*.

In some embodiments, the via pattern 178*v* functions according to a principle similar to that of the via pattern 138*v* or 168*v* and improves the overall sensitivity of the membrane 120 due to increased areas of high and medium intensities of strain, and the sensing or actuation performance is enhanced.

Figure 3D:
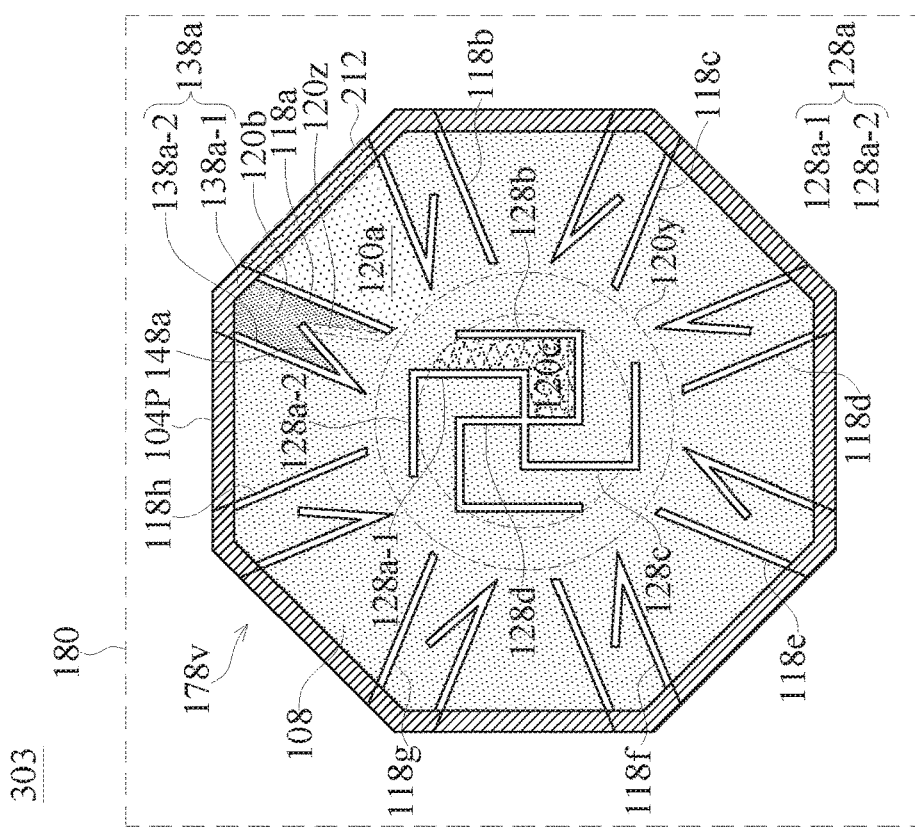

Referring to FIG. 3D, a top view 304 of a via pattern 188*v* is shown. The via pattern 188*v* can be regarded as a variant of the via pattern 178*v* shown in FIG. 3C, except that second type lines 128 of the via pattern 188*v* include more line segments than the via pattern 178*v*.

In some embodiments, each of the second type lines 128 is a polyline including at least four line segments, e.g., five line segments. In some embodiments, the second type lines 128 cut through the center of the membrane 120 and form multiple cups facing the center of the membrane 120. In some embodiments, referring to FIGS. 3C and 3D, the second type lines 128 of the via pattern 188*v* partition the membrane into fourth type slices 120*d* in addition to the third type slices 120*c*. The fourth type slices 120*d* may have a cup shape. The third type slices 120*c* are configured to bend toward the edge 180 of the membrane 120. A connected region 120*w* is formed around the lips of the cups in the fourth type slices 120*d*. In some embodiments, the connected region 120*z* is formed between the first type line 118, e.g., line 118*a*, and the corresponding fourth type line 148, e.g., line 148*a*, and the fourth type slices 120*d* are configured to bend toward the center of the membrane 120 with the connected region 120*w* acting as a pseudo anchor.

In some embodiments, the via pattern 188*v* functions according to a principle similar to that of the via pattern 178*v* and improves the overall sensitivity of the membrane 120 due to increased areas of high and medium intensities of strain, and the sensing or actuation performance is enhanced.

Figure 4:
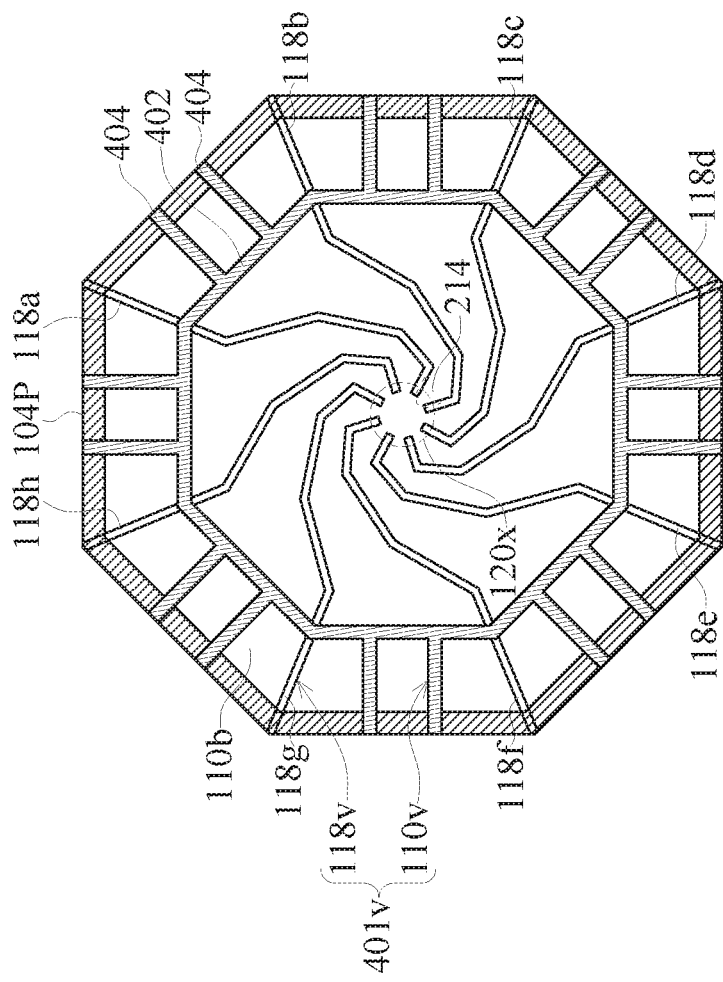
FIG. 4 is a schematic plan view of an electrode layer of a MEMS device, in accordance with some embodiments.

FIG. 4 is a schematic plan view 401 of the electrode layer of the MEMS device 10, in accordance with some embodiments. In FIG. 4 the second electrode layer 110*b* is used as an example. The second electrode layer 110*b* is partitioned into several portions by a partitioning pattern 401*v* composed of a partitioning pattern 110*v* and the via pattern 118*v*. As discussed previously with reference to FIG. 1C, vias 110*v*-1 and 110*v*-2 with respective via patterns 110*p* and 110*q* may be formed in the respective electrode layers 110*a* and 110*b* through patterning operations on the electrode layers 110*a* and 110*b*. The via 110*v*-1 is filled with the subsequently deposited piezoelectric layer 108. As a result, a partitioning pattern 110*v* filled with piezoelectric materials is formed in the electrode layer 110. In addition, although not shown in FIG. 4 but illustrated in FIG. 1I, the via 110*v*-2 in the second electrode layer 110*b* are not filled with piezoelectric materials, and expose the underlying piezoelectric layer 108.

The electrode layer 110*a* or 110*b* is further patterned with a via pattern, e.g., the via pattern 118*v*, by respective patterning operations described in relation to FIG. 1F during patterning of the piezoelectric layer 108. A resultant via pattern 401*v* of the exemplary electrode layer 110*b* is obtained accordingly. In some embodiments, the electrode layer patterning operation is absent during forming of the MEMS device 10, and thus the electrode layer 110*c* only includes the via pattern 118*v* identical to that shown in the piezoelectric layer 108.

In some embodiments, the via pattern 118*v* is different from the partitioning pattern 110*v* in that the via pattern 118*v* is formed of hollow vias acting as venting holes of the MEMS device 10, while the partitioning pattern 110*v* is filled with solid materials, such as piezoelectric materials of the piezoelectric layer 108. In some embodiments, the partitioning pattern 110*v* includes lines of elongated shapes that partition the second electrode layer 110*b* into separate portions as electrodes. In some embodiments, the partitioning pattern 110v includes a first type line 402 and second type lines 404 connected to the first type line 402. In some embodiments, the first type line 402 has a polygonal shape, such as an octagonal shape or a ring shape. For example, the first type line 402 separates the second electrode layer 110b into a circular portion and a core portion. As can be seen in FIG. 4, in a finalized MEMS device 10 the core portion is further patterned by the via pattern 118v to form multiple core zones as electrodes with a connected region 120x formed at the center of the second electrode layer 110b.

In some embodiments, the second type lines 404 further partition the circular portion into multiple quadrilateral zones as electrodes. The quadrilateral zones may be electrically isolated from one another and electrically isolated from the core zones by the partitioning pattern 110v.

Referring to FIG. 1I and FIG. 4, each of the conductive lines 112 may be electrically coupled to the electrode layers 110a and 110b. In some embodiments, some portions or zones in the electrode layer 110a or 110b may be electrically coupled to one or more of the conductive lines 112a and 112b. Some other portions or zones may not be electrically coupled to any conductive lines in some other embodiments and thus are electrically insulated in the membrane 120.

According to an embodiment, a semiconductor device includes a substrate and a membrane over the substrate. The membrane includes a piezoelectric material configured to generate charges in response to an acoustic wave. The membrane includes a via pattern having first lines that partition the membrane into slices such that the slices are separated from each other at a first region near an edge of the membrane and connected to each other at a second region.

According to an embodiment, a MEMS device includes a substrate, a dielectric layer over the substrate, and a membrane over the dielectric layer. The membrane includes a piezoelectric layer configured to move in a cavity defined by the dielectric layer, an electrode layer configured to transfer charges generated by the piezoelectric layer, and first vias running through the piezoelectric layer and the electrode layer. The first vias include elongated shapes extending from near an edge of the piezoelectric layer toward a center of the piezoelectric layer without connecting to one another.

According to an embodiment, a method of manufacturing a MEMS device includes: providing a substrate; depositing a protection layer over the substrate; forming an electrode layer over the protection layer; depositing a piezoelectric layer over the protection layer and the electrode layer; forming a via running through the protection layer, the electrode layer and the piezoelectric layer, the via defining a first pattern and partitioning the piezoelectric layer into slices such that the slices are separated from each other at a first region near an edge of the piezoelectric layer and joined to each other at a second region near a center of the piezoelectric layer; and forming a cavity in the substrate beneath the protection layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate; and
   a membrane over the substrate, the membrane comprising a piezoelectric material configured to generate charges in response to an acoustic wave,
   wherein the membrane comprises a via pattern having first lines that partition the membrane into slices such that the slices are separated from each other at a first region near an edge of the membrane and connected to each other at a second region,
   wherein the via pattern further comprises second lines extending from the edge of the membrane toward a center of the membrane, each of the second lines comprising a length less than a length of each of the first lines.

2. The semiconductor device of claim 1, wherein each of the first lines comprises an elongated shape from a top-view perspective and allows air to pass through.

3. The semiconductor device of claim 1, wherein each of the first lines comprises a straight line from a top-view perspective.

4. The semiconductor device of claim 1, wherein the via pattern further comprises third lines starting around a center of the membrane toward the edge of the membrane from a top-view perspective, the third lines being spaced apart from the first lines.

5. The semiconductor device of claim 4, wherein the third lines meet at the center of the membrane.

6. The semiconductor device of claim 4, wherein each of the third lines comprises a polyline.

7. The semiconductor device of claim 1, wherein the via pattern forms a symmetric pattern with respect to the center of the membrane.

8. The semiconductor device of claim 1, further comprising a dielectric layer between the membrane and the substrate, wherein the second lines expose the dielectric layer.

9. The semiconductor device of claim 1, further comprising a dielectric layer coupling the membrane to the substrate and including a polygonal shape having sides connected to one another, and wherein at least one of the first lines terminates at a location of the membrane directly over the one of the sides.

10. The semiconductor device of claim 1, wherein the second region is around a center of the membrane.

11. A MEMS device, comprising:
    a substrate;
    a dielectric layer over the substrate; and
    a membrane over the dielectric layer; the membrane comprising:
       a piezoelectric layer configured to move in a cavity defined by the dielectric layer;
       an electrode layer configured to transfer charges generated by the piezoelectric layer; and
       first vias running through the piezoelectric layer and the electrode layer, wherein the first vias comprise elongated shapes extending from near an edge of the piezoelectric layer toward a center of the piezoelectric layer without connecting to one another.

12. The MEMS device of claim 11, wherein the electrode layer comprises a partitioning pattern partitioning the electrode layer and formed of a material of the piezoelectric layer, and wherein the electrode layer comprises electrodes separated from each other and defined by the first vias and the partitioning pattern.

13. The MEMS device of claim 11, wherein the first vias define a symmetrical pattern and comprise polylines.

14. The MEMS device of claim 11, wherein the piezoelectric layer further comprises second vias radially arranged between the center of the piezoelectric layer and the first vias.

15. The MEMS device of claim 11, wherein the first vias form a slice configured to bend toward the center of the piezoelectric layer.

16. The MEMS device of claim 11, wherein one of the first vias comprises a portion extending over a side of the dielectric layer adjacent to an edge of the membrane and exposing the dielectric layer.

17. The MEMS device of claim 11, further comprising conductive lines electrically coupled to the electrode layer.

18. A method of manufacturing a MEMS device, comprising:
    providing a substrate;
    depositing a protection layer over the substrate;
    forming an electrode layer over the protection layer;
    depositing a piezoelectric layer over the protection layer and the electrode layer;
    forming a via running through the piezoelectric layer, the electrode layer and the protection layer, the via defining a first pattern and partitioning the piezoelectric layer into slices such that the slices are separated from each other at a first region near an edge of the piezoelectric layer and joined to each other at a second region near a center of the piezoelectric layer; and
    forming a cavity in the substrate beneath the protection layer.

19. The method of claim 18, wherein the forming of the electrode layer over the protection layer comprises depositing a conductive layer over the protection layer and patterning the conductive layer with a second pattern different from the first pattern.

20. The method of claim 18, further comprising forming a conductive line electrically coupled to the electrode layer.

* * * * *